United States Patent [19]

Goronkin

[11] 4,373,255
[45] Feb. 15, 1983

[54] METHOD OF MAKING OXIDE PASSIVATED MESA EPITAXIAL DIODES WITH INTEGRAL PLATED HEAT SINK

[75] Inventor: Herbert Goronkin, Scottsdale, Ariz.

[73] Assignee: The United States of America as represented by the Secretary of the Air Force, Washington, D.C.

[21] Appl. No.: 270,050

[22] Filed: Jun. 3, 1981

Related U.S. Application Data

[62] Division of Ser. No. 50,272, Jun. 19, 1979, Pat. No. 4,340,900.

[51] Int. Cl.³ .................. H01L 29/06; H01L 29/90
[52] U.S. Cl. ........................... 29/580; 29/589; 29/590; 156/649; 156/657; 357/56
[58] Field of Search .............. 357/56; 29/580, 589, 29/590; 156/649, 657

[56] References Cited

U.S. PATENT DOCUMENTS 3,895,429 7/1975 Huang et al. .................. 29/580
3,903,592 9/1975 Heckl ............................ 29/580 X
4,028,140 6/1977 Summers et al. ............. 357/56 X

OTHER PUBLICATIONS

Wright, G. T., "Transistor Transit-Time Oscillator (Translator)", in *Electronics Letters*, vol. 12, No. 2, 1/22/1976, pp. 37-38.

*Primary Examiner*—L. Dewayne Rutledge
*Assistant Examiner*—Alan E. Schiavelli
*Attorney, Agent, or Firm*—Donald J. Singer; Casimer K. Salys

[57] ABSTRACT

An oxide passivated mesa epitaxial diode with an integral heat sink, and a process by which it may be fabricated. The passivation layer of highly pure thermally grown $SiO_2$ is formed over the mesa walls in the region of the pn junction without causing a reaction between the contact metals and their surroundings during the high temperature environment imposed during thermal growth. The heat sink is deposited after the $SiO_2$ passivation has been grown, replacing a polycrystalline silicon layer beneath the mesa formation which was used as a temporary structural support. Dopant, to form the pn junction, is introduced into the silicon wafer after the formation of the passivation layer but before the heat sink is deposited.

5 Claims, 7 Drawing Figures

METHOD OF MAKING OXIDE PASSIVATED MESA EPITAXIAL DIODES WITH INTEGRAL PLATED HEAT SINK

RIGHTS OF THE GOVERNMENT

The invention described herein may be manufactured and used by or for the Government of the United States for all governmental purposes without the payment of any royalty.

This is a division of application Ser. No. 050,272, filed June 19, 1979, now U.S. Pat. No. 4,340,900, issued July 20, 1982.

BRIEF SUMMARY

The present invention is directed to a semiconductor device and a method by which the device may be fabricated. With more particularity, the device comprises an oxide passivated mesa epitaxial diode with an integral heat sink and is fabricated in such a manner that the junction is passivated by the thermal growth of an oxide layer over the junction region without causing a reaction between the contact metals and the surrounding environment.

In one form, the diode takes the shape of a mesa upon a supporting structure of thermally conductive metal, the latter serving both as an electrical contact and thermal heat sink. Directly upon the metallic base is the first semiconductor layer of the mesa, a heavily doped material of the first conductivity type. Covering the latter layer of the mesa is a layer of lightly doped material of the second conductivity type, opposite that of the first, forming therebetween a pn junction. Upon the lightly doped layer is a heavily doped layer of the same conductivity type, which is covered, at the mesa top, by a metallic contact. The side walls of the mesa structure, particularly in the region of the pn junction, are covered by a layer of highly pure $SiO_2$ material. The resultant device has low thermal and electrical resistance without sacrificing the quality of the surface passivation at the pn junction.

DETAILED DESCRIPTION

The thermal and electrical resistance properties of semiconductor diodes operating at microwave frequencies significantly affects their ultimate performance. Recently developed techniques for plating of the heat sinks directly onto the diode wafers are directed at improving such performance characteristics. Similarly, a process by which the junction in a mesa structure diode is passivated using thermally grown oxides has shown to produce low containment levels at the passive junction.

Figure 1:
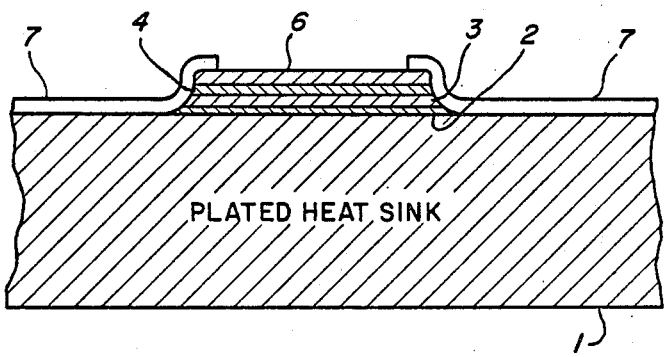
FIGS. 1 and 2 are cross-sectional schematics of prior art configurations.

Unfortunately, the two technological approaches have until now proven to be substantially incompatible. As a representative example, consider the varactor type of tuning diode shown in FIG. 1. The mesa epitaxial diode shown in the figure is fairly conventional, with plated heat sink 1 attached directly to p+ layer 2. Layer 3 of n type material and n+ type layer 4 are covered by metallized contact 6. The pn junction formed between layers 2 and 3 is protected by passivation layer 7. The mesa structure of the diode is etched in conventional fashion using photolithographic techniques, with the passivation layer being applied as one of the latter steps. Since thermally grown oxides require temperatures in excess of 1000° C., so high as to react contact metals such as layers 1 and 6 with their surroundings, passivation is normally done with pyrolytic oxides, such as those of $SiO_2$. These oxides are capable of being deposited at temperatures in the range of 300°–400° C. However, such low temperature passivation materials are also low in density and not hermetically stable. Often, these low melting temperature pyrolytic oxides are slightly contaminated with sodium or other elements, in relative comparison to thermally grown $SiO_2$, introducing a detrimental leakage current in shunt with the pn junction created by the migration of ions in the passivation layer. High quality passivation is the means by which a diode of this class is made both reliable and stable with regard to long term drift.

Figure 2:
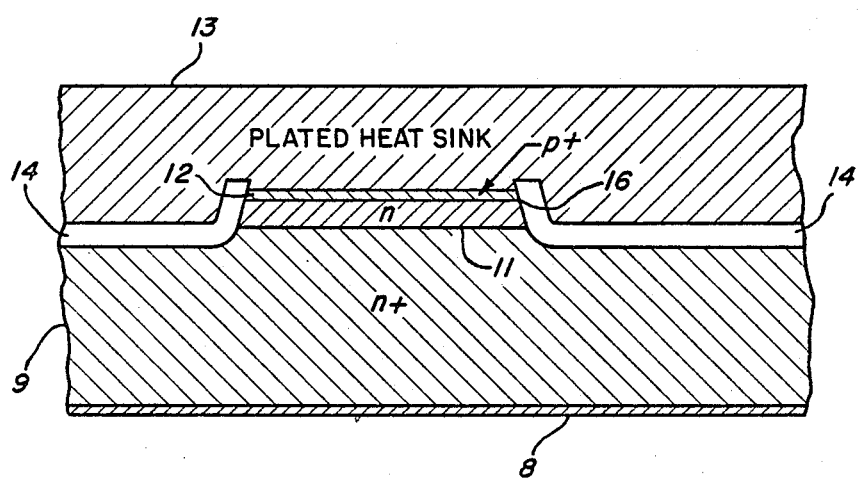

The structure typifying an alternate prior art approach to fabricating a mesa epitaxial diode with an integral heat sink is depicted schematically in the cross section of FIG. 2. The structure consists of a lower electrical contact layer 8, n+ type layer 9, n type layer 11, p+ type layer 12, plated heat sink layer 13, and passivation layer 14. A pn junction, 16, is formed at the interface of layers 11 and 12. Since passivation layer 14 is formed in conventional fashion prior to the formation of the electrical contacts, high temperatures may be utilized to thermally grow a passivation layer of $SiO_2$. Nevertheless, to prevent crazing of the oxide layer due to thermal mismatches with the underlying silicon, passivation layer 14 is limited to a thickness less than 2 microns. Unfortunately, a thickness of 2 microns or less for layer 14 is an insufficient separation between the electrical contact formed by heat sink layer 13 and the electrically conductive paths on the opposite side of pn junction 16. The result is a mesa diode exhibiting excessive parasitic reactances.

The invention disclosed herein overcomes these enumerated deficiencies, providing both a diode structure and a process for its fabrication. The particular embodiment described pertains to a silicon varactor tuning diode of an epitaxial mesa configuration, though it does apply with equal import to other types of microwave diodes in which high quality passivation and low thermal impedance are of prime consideration. Examples of such include, but are not limited to, IMPATT diodes, multiplier diodes and PIN diodes.

Figure 3:
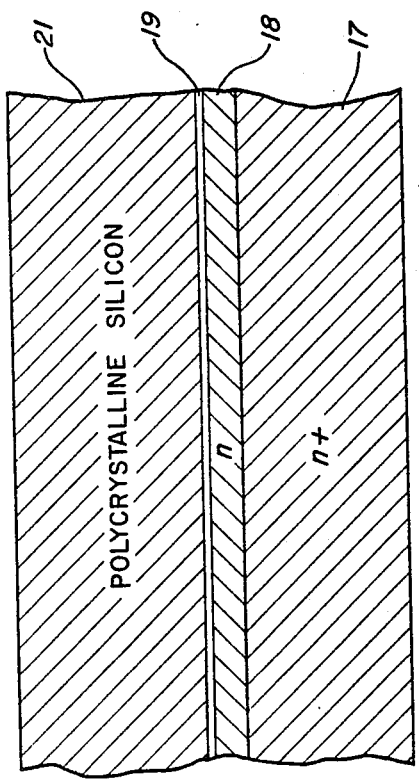

Attention is directed to FIG. 3, where starting materials are shown to encompass a heavily doped n+ type silicon substrate layer 17 covered by a lightly doped n type silicon active layer 18. Arsenic or antimony is recommended for the substrate dopant. As a general rule the active region is n type because electrons have higher mobility than holes in silicon, though the structure and procedure here disclosed is not so limited. The pn junction is formed subsequently by introduction of p+ dopant into n type layer 18 at a later point in the process.

A $SiO_2$ layer 19 is thermally grown to cover n type layer 18 to a depth in the range of 1000 angstroms. Deposited thereon is polycrystalline silicon layer 21 to a depth of 100 microns for subsequent use as a temporary structural support. Upon the completion of the latter step, the cross section of the layers appears as shown in FIG. 3.

Figure 4:
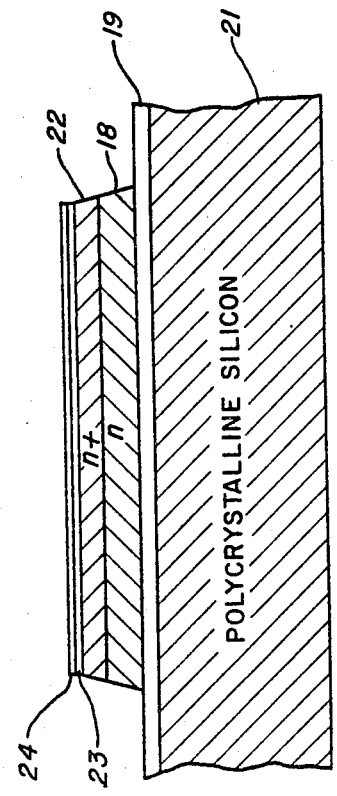

To reach the level of fabrication depicted in FIG. 4, n+ type layer 17 is first reduced in thickness by any appropriate thinning technique until it is 2-5 microns thicker than n type layer 18. A thermal growth of $SiO_2$ to a depth of approximately 1000 angstroms is then created on the surface of the remaining n+ type silicon. The $SiO_2$ layer, 23, is then covered by 1000 angstroms of $Si_3N_4$, layer 24, using conventional chemical vapor deposition (CVD) techniques. Once the diode pattern has been photolithographically defined, the $Si_3N_4$ layer is plasma etched in a conventional manner to leave a layer of $Si_3N_4$ directly over the area selected to be the diode mesa. The $SiO_2$ exposed by the etching of the $Si_3N_4$ layer is then etched away, leaving a thin mesa structure consisting of $Si_3N_4$ layer 24 over $SiO_2$ layer 23. Using an alkali solution which etches neither the $SiO_2$ nor the $Si_3N_4$ the exposed silicon layers, n type layer 18 and thinned layer 22 of n+ type silicon, are etched down to $SiO_2$ layer 19 on polycrystalline silicon 21. The mesa structure remaining appears in FIG. 4, showing the remanents of n type layer 18, n+ type layer 22, $SiO_2$ layer 23 and $Si_3N_4$ layer 24.

A less preferred technique for creating the epitaxial mesa form in FIG. 4 entails the deposition of 2000 angstroms CVD $SiO_2$ over the 1000 angstroms of $Si_3N_4$ prior to photolithographic definition of the diode pattern. Masking and etching then proceeds in a conventional manner through the CVD $SiO_2$ layer, the $Si_3N_4$ layer and the $SiO_2$ layer, until thinned n+ type silicon layer 22 is exposed for alkali solution etching in the manner described hereinbefore.

For purposes of relative comparison, the combined thickness of n type layer 18 and n+ type layer 22 in FIG. 4 is in the approximate range of 10 to 25 microns.

A layer 1 to 1.5 microns thick of $SiO_2$ is thermally grown on the silicon mesa and polycrystalline silicon support structure 21, effectively isolating n type layer 18 and n+ type layer 22 within a $SiO_2$ material formation, generally designated 26. $Si_3N_4$ layer 24 does not oxidize during this step. The structure so created is depicted in FIG. 5.

Figure 5:
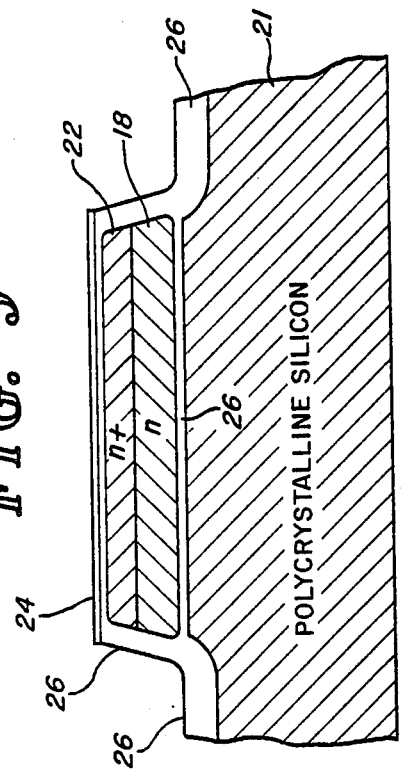
FIGS. 3 through 6 illustrate the device at various steps in the fabrication process.
Figure 6:
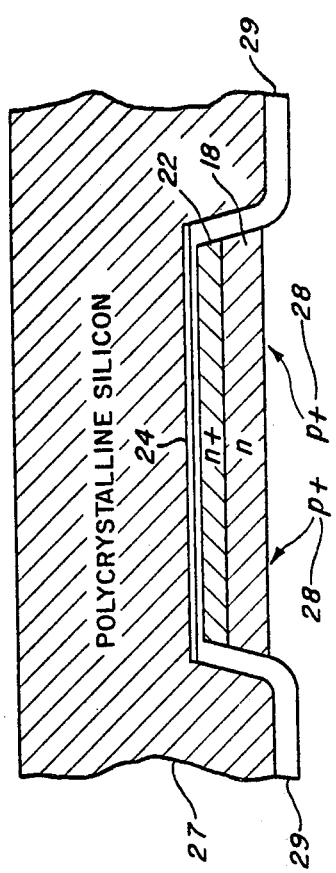

Commencing with the structure shown in FIG. 5 polycrystalline silicon 27 is deposited by conventional means over the mesa side to a thickness in the range of 100 microns. Thereafter, polycrystalline silicon support layer 21 is etched away with an alkali solution which does not attack $SiO_2$ formation 26. To expose n type layer 13, $SiO_2$ formation 26 is etched from beneath to remove approximately 1000 angstroms. The resulting structure resembles that depicted in FIG. 6. The pn junction is then created in n type layer 18 by implanting or diffusing p+ type dopant 28 into the surface of the layer. The p+ region can be made very shallow and abrupt if the thickness of n type layer 18 is carefully controlled during its formative steps.

Figure 7:
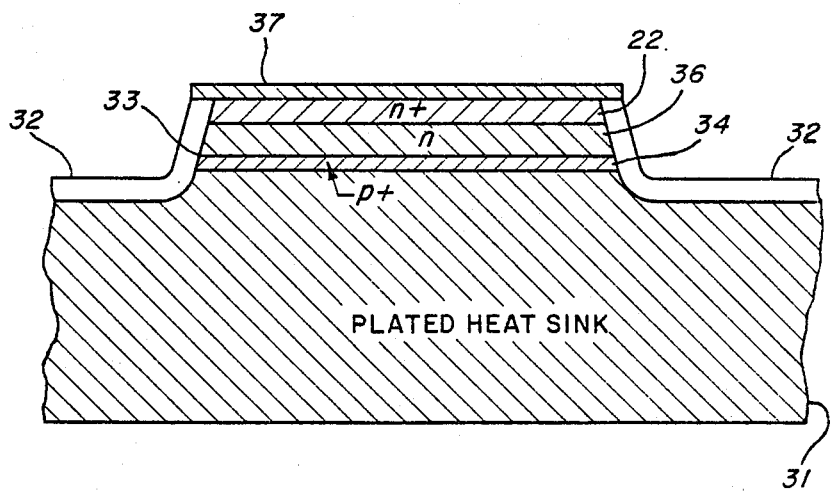
FIG. 7 is a cross-sectional schematic of an embodying device, fabricated in accordance with the disclosed process.

After the p+ region is created in n type layer 18, heat sink and electrical contact layer 31 of silver or copper is metallized and plated directly onto the newly created p+ region and remaining $SiO_2$ formation 29. Reference is directed to FIG. 7. A representative thickness for layer 31 is 100 microns. Polycrystalline silicon 27 is then etched away completely. Following this, exposed $Si_3H_4$ layer 24 is selectively etched away using a solution such as phosphoric acid which does not disturb the $SiO_2$. Thereafter, 1000 angstrons of $SiO_2$ is etched away, exposing only the surface of n+ type layer 22, while leaving a residual layer 32 of $SiO_2$ passivation on the side walls of the mesa epitaxial structure. The pn junction, 33, between p+ type region 34 and n type layer 36 remains passivated. The mesa epitaxial diode is completed, as shown in FIG. 7, when metallization layer 37 is formed over the top of the mesa by conventional means.

As noted hereinbefore the use of an n type active region is generally preferred, but the structure and process disclosed is not so limited. Though the finite steps described herein admit to digressions within the allowances of known technology, such limited departures remain within the spirit and scope of the invention.

I claim:

1. A method of making a silicon mesa epitaxial diode, comprising the steps of:
    a. forming a silicon substrate having a heavily doped layer and a lightly doped layer, both layers being of the first conductivity type;
    b. thermally growing a thin layer of $SiO_2$ on the lightly doped layer;
    c. depositing a thick layer of polycrystalline silicon over the $SiO_2$ layer to serve as a temporary structural support;
    d. thermally growing a thin layer of $SiO_2$ on the heavily doped layer;
    e. depositing a thin layer of $Si_3N_4$ over the $SiO_2$ grown in step d;
    defining a diode pattern on the $Si_3N_4$ layer;
    g. etching through the $Si_3N_4$ and the $SiO_2$ layers in the region outside the diode pattern;
    h. etching through the lightly and heavily doped layers of silicon to form a mesa-like structure;
    i. thermally growing a moderate thickness layer of $SiO_2$ on the sidewalls of said mesa-like structure and on the polycrystalline silicon;
    j. depositing a thick layer of polycrystalline silicon over the $SiO_2$ grown in step i;
    k. etching away the polycrystalline silicon temporary support structured deposited in step c;
    l. etching the $SiO_2$ exposed during step k from the surface of the lightly doped layer;
    m. introducing dopant of the second conductivity type, opposite that of the first, into the lightly doped layer;
    n. plating a thick layer of electrically and thermally conductive material on the area doped in step m;
    o. etching away the polycrystalline silicon deposited during step j;
    p. etching away the $Si_3N_4$ over the diode pattern;
    q. etching the $SiO_2$ from the surface of the heavily doped layer; and
    r. depositing a layer of electrically conductive material on the surface of the heavily doped layer.

2. The method recited in claim 1, wherein a thin layer is defined to have a thickness of approximately 0.1 microns (1000 angstroms) or less, a moderate thickness layer is approximately 1 to 5 microns in thickness, and a thick layer is one having a thickness of approximately 100 microns or more.

3. The method recited in claim 1, wherein the etching in step h is accomplished using an etching solution which does not etch $Si_3N_4$ or $SiO_2$.

4. The method recited in claim 1, wherein the etching in steps k and p is accomplished using an etching solution which does not etch $SiO_2$.

5. A method of making a silicon epitaxial diode comprising the steps of:
  a. forming a silicon substrate having a heavily doped layer and a lightly doped layer, both layers being of the first conductivity type;
  b. thermally growing a layer of $SiO_2$ on the lightly doped layer;
  c. depositing a first temporary support layer on the $SiO_2$ in step b;
  d. thermally growing a layer of $SiO_2$ on the heavily doped layer;
  e. depositing a layer of $Si_3N_4$ over the $SiO_2$ in step d;
  f. defining a diode pattern on the $Si_3N_4$ layer;
  g. etching through the $Si_3N_4$ and the $SiO_2$ layers in the region outside the diode pattern;
  h. etching through the lightly and heavily doped layers of silicon to form a mesa-like structure;
  i. thermally growing a layer of $SiO_2$ on the sidewalls of the mesa-like structure;
  j. depositing a second temporary support layer on the $SiO_2$ in step i;
  k. removing the first temporary support layer;
  l. etching the $SiO_2$ from step b to expose the lightly doped layer;
  m. introducing dopant of the second conductivity type, opposite the first conductivity type, into the lightly doped layers so as to form a pn junction;
  n. plating a thick layer of thermally and electrically conductive material on the area doped in step m;
  o. removing the second temporary support layer;
  p. etching away the $Si_3N_4$ over the diode pattern;
  q. etching the $SiO_2$ from the surface of the heavily doped layer; and
  r. depositing a layer of electrically conductive material on the surface of the heavily doped layer.

* * * * *